US006923553B2

(12) United States Patent
Mackin

(10) Patent No.: US 6,923,553 B2
(45) Date of Patent: Aug. 2, 2005

(54) HANDLAMP

(75) Inventor: Michael P. Mackin, Chicago, IL (US)

(73) Assignee: Woodhead Industries, Inc., Deerfield, IL (US)

( * ) Notice: Subject to any disclaimer, the term of this patent is extended or adjusted under 35 U.S.C. 154(b) by 0 days.

(21) Appl. No.: 10/462,886

(22) Filed: Jun. 17, 2003

(65) Prior Publication Data

US 2004/0012949 A1 Jan. 22, 2004

Related U.S. Application Data

(60) Provisional application No. 60/396,443, filed on Jul. 16, 2002.

(51) Int. Cl.[7] .................................................. G11C 7/00

(52) U.S. Cl. ....................... 362/202; 362/186; 362/279; 362/282; 362/290; 362/344; 362/400; 362/376

(58) Field of Search ................................ 362/202, 186, 362/208, 279, 282, 290, 322, 344, 358, 400, 376, 377, 378, 399, 374, 375

(56) References Cited

U.S. PATENT DOCUMENTS 811,810 A * 2/1906 Wood ......................... 362/376
1,334,710 A * 3/1920 Miners ....................... 362/344
2,703,838 A * 3/1955 Woodhead, Jr. ............. 362/344
5,117,345 A 5/1992 Baake
5,738,438 A 4/1998 Hesprich
5,860,730 A 1/1999 Hesprich
5,921,658 A 7/1999 Kovacik
6,170,966 B1 * 1/2001 Schwarzmann ............. 362/376

* cited by examiner

*Primary Examiner*—Sandra O'Shea
*Assistant Examiner*—Sharon Payne
(74) *Attorney, Agent, or Firm*—Emrich & Dithmar LLC

(57) ABSTRACT

An electrical handlamp includes a casing molded in two sections which are secured together and cooperate to define a handle for housing a lamp socket and wire connections from a supply cord to the socket. One handle section is integrally molded to provide a closed half shell for partially surrounding and housing a lamp. A protective cage is mounted for rotation about an axis between a closed position protecting the lamp and an open position for replacing the lamp. A hook at the top of the half shell rotatably mounts the top of the protective cage, and the bottom of the cage is rotatably received on the socket. A clasp releaseably latches the cage to the half shell in the closed position of the cage.

6 Claims, 3 Drawing Sheets

HANDLAMP

This application claims the benefit of U.S. Provisional Application No. 60/396,443 filed on Jul. 16, 2002.

FIELD OF THE INVENTION

The present invention relates to electrical handlamps; and more particularly to an electrical handlamp for incandescent lamps.

BACKGROUND OF THE INVENTION

It is desirable to manufacture electrical handlamps which are capable of withstanding the rigors of commercial use, such as frequent use by tradesmen, but which are also economical to manufacture and therefore available at more reasonable prices than heretofore has been the case.

On the other hand, it is also desirable to provide additional features to commercial handlamps which facilitate their use, including re-lamping and flexibility of positioning the lamp, while providing sufficient strength to the handlamp to resist breaking of the handlamp upon being dropped to the floor or otherwise subject to rough use.

SUMMARY OF THE INVENTION

The present invention addresses these matters by including a housing which is molded of rugged plastic such as polyethylene in two sections which form a handle when secured together. One unitary section extends beyond the handle to form a half shell for receiving and housing the lamp.

The handle houses a socket for the lamp and the connections between an electrical supply cord and the socket.

A guard in the form of a half cage is pivotally mounted to rotate between a closed position, in which the cage and half shell cooperate to enclose and protect the lamp, and an open position, in which the guard is nested within the half shell and the lamp is freely accessible for maintenance.

The upper portion of the guard is pivotally mounted to the half shell by a hook which is assembled and snap-fit into aligned apertures in the guard and the half shell. The lower end of the guard is mounted for rotary motion about the collar fit onto the lamp socket.

The guard is releaseably secured in the closed position by a latch formed between the guard and the half shell.

There is thus formed a handlamp which is capable of withstanding use conditions well beyond the occasional household use, which provides convenience features in protecting, changing or tightening the lamp, and yet which is substantially free of metal parts and has reasonable manufacturing costs, thus benefitting the consumer.

Other features and advantages will be apparent to persons skilled in the art from the following detailed description, accompanied by the attached drawing, in which the same reference numerals refer to like parts in the various views.

DETAILED DESCRIPTION OF THE ILLUSTRATED EMBODIMENT

Figure 1:
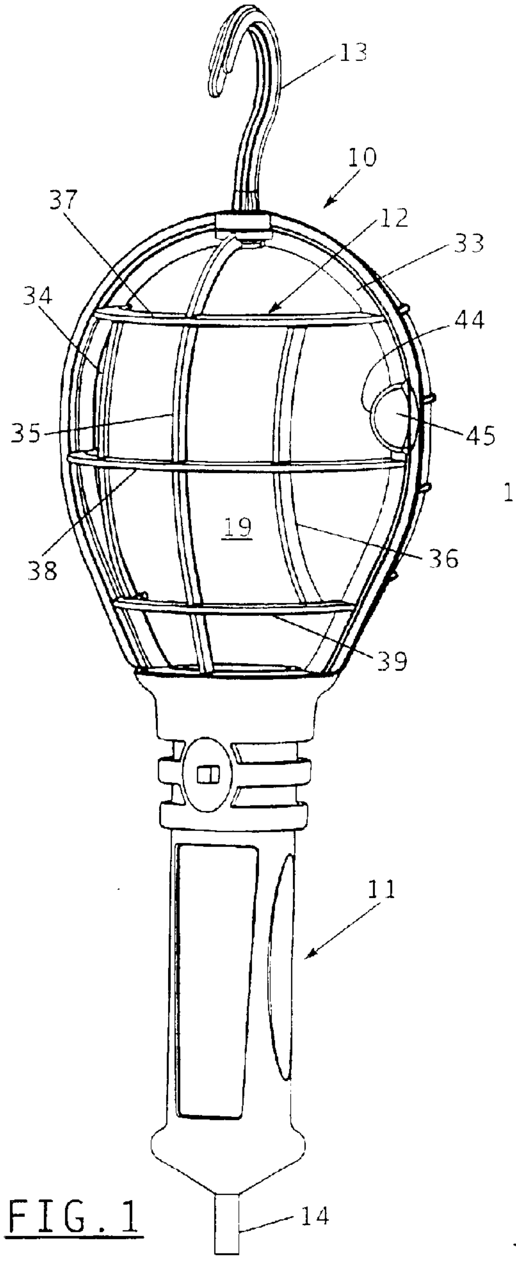
FIG. 1 is an elevational view of a handlamp constructed according to the present invention taken from an angle to the right of a vertical center plane and with the protective guard closed.
Figure 2:
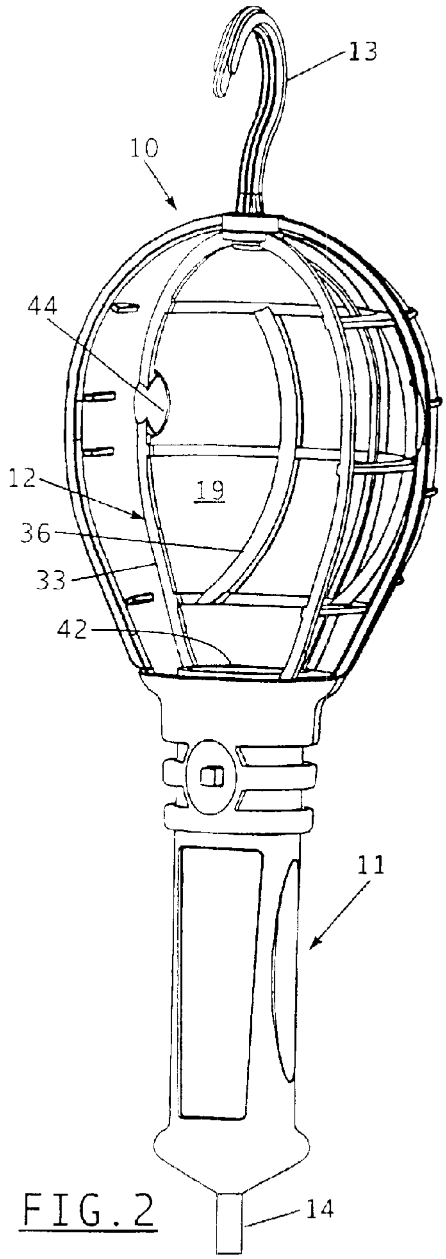
FIG. 2 is a view similar to FIG. 1 with the protective guard rotated to the open position for lamp replacement.

Referring first to FIGS. 1 and 2, Reference 10 generally designates a handlamp constructed according to the present invention. The handlamp 10 includes a handle generally designated 11, a lamp guard 12 in the form of a gridwork, a hook 13, and an electrical power cord 14 (shown in fragmentary form) which may conventionally include insulated wires and a male connector (not shown).

Figure 4:
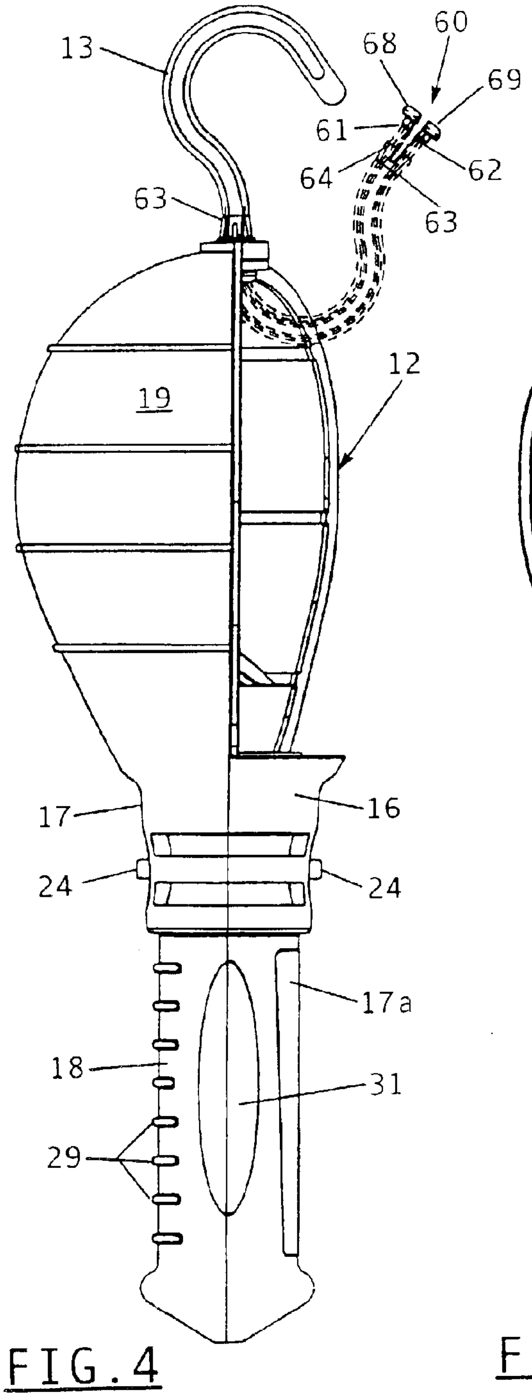
FIG. 4 is a left side view of the handlamp with the guard in the open position.
Figure 6:
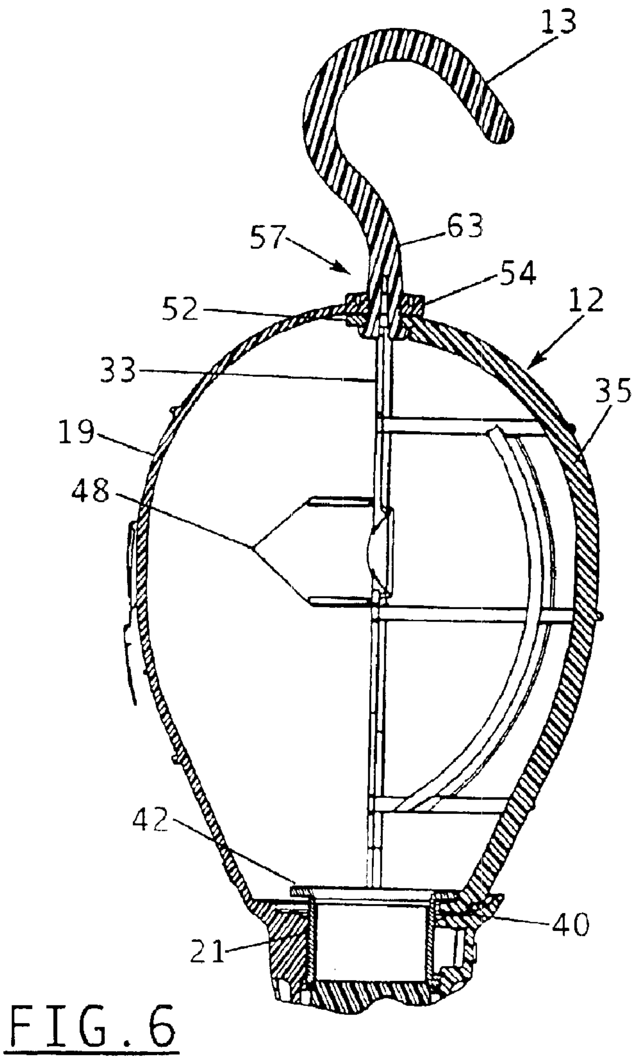
FIG. 6 is a vertical cross sectional fragmentary view taken from the left side and with the guard in the closed position.

Referring to FIG. 4, the handle 11 is molded into two separate pieces, including a front section 16 and a rear section 17. The rear piece 17 includes an integral handle portion 18 and a back section in the form of an upper half shell portion generally designated 19 which is closed, and shaped to receive an incandescent lamp (shown in dashed line, FIG. 6) received in a conventional screw socket which has a flanged collar 21 as seen in FIG. 6.

The lower handle portion 18 of the rear section 17 cooperates with the front section 16 of the handle to receive and house the power cord 14 in sealing engagement and to form a protective closure for the electrical connections to a conventional switch, the double actuators of which are seen at 24 in FIG. 4, and connections to the lamp socket.

The front handle section 16 is provided with an elastomer insert 17*a* which forms a grip pad for the user. The rear of the lower handle portion 18 of the rear handle section 17 is provided with a series of vertically spaced curved ribs 29 as one means for providing an enhanced, comfortable grip for the fingers of a user.

It will be observed from FIG. 4 that the entire handle rear section 17, including the lower rear handle portion 18 and the upper shell 19 is integrally molded. This provides beam strength for the entire handlamp while providing a convenient opaque shell for approximately one-half of the lamp in operation. The width of the overall handle may be reduced near the mid point, designated 31 in FIG. 3, if desired, in order to add further comfort for gripping.

Turning now to FIGS. 1 and 2, the guard 12, may be an integrally molded plastic part including a rear peripheral frame 33, three vertically extending ribs 34, 35 and 36, and three horizontally extending ribs designated respectively 37, 38 and 39. All the vertical ribs interconnect with all the horizontal ribs to form a protective grid for the lamp and to provide safety to the user. Referring particularly to FIG. 6, the lower portion of the frame 33 includes a semi-circular flange 40 (FIG. 6), which is slidably received beneath an upper peripheral flange 42 of the collar 21.

Figure 5:
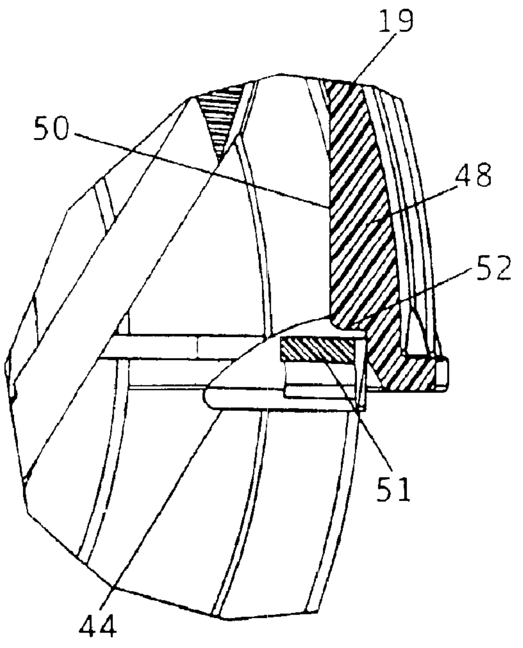
FIG. 5 is a enlarged fragmentary cross sectional view taken through the site line 5—5 of FIG. 3 showing the latch engaged.

A clasp or latch is formed between frame 33 of the guard 12 and the upper shell 19 of the rear section 17. An actuator pad 44 having an outer concave surface 45 is integrally molded to the frame member 33 of the guard. A pair of ribs, spaced apart vertically and designated 48 in FIG. 6, are formed on the inner surface of the upper shell 19 adjacent the front opening. Each of the ribs 48 is tapered to form a ramp having an increased height or distance from the upper shell 19 when proceeding from the rear of the shell toward the front opening of the shell, as indicated by the surface 50 in FIG. 5 which is a view looking downwardly. In the position of FIG. 5, the guard 12 is in the use or latched position seen in FIGS. 1 and 3; and a rear latching surface 51 located on the actuator 44 engages a corresponding front surface 52 on the rib 48.

To unlock the guard and move it to the open position, one places a thumb or finger in the curved surface 45 of the actuator pad 44 and pushes toward the rear of the lamp. This flexes the outer frame 33 sufficiently to enable the surface 51 formed at the rear of the frame member 33 to ride over the latching surface 52 and along the ramp surface 50 to the open position of FIG. 2.

Conversely, if it is desired to place the guard in a locked or closed position, the guard is rotated clockwise when viewed from the top, and the peripheral frame 33 of the guard rides along the ramp surfaces 50, where it is flexed inwardly until it passes over the ramp, and it is then secured in the closed position for use, as seen in FIG. 5.

The guard 12 is rotatably secured to the handlamp at the bottom by means of the lower curved flange 40 which is slidably received beneath the flange 42 of the collar 21, and at its upper portion by means of a journal formed by the hook 13, as will now be described.

Figure 3:
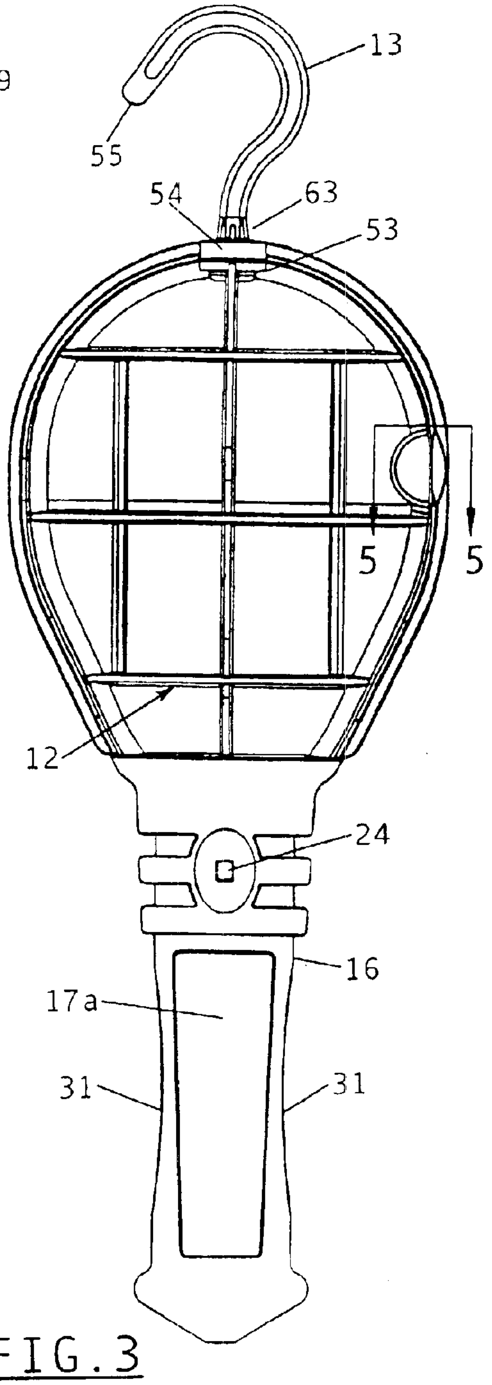
FIG. 3 is a front elevational view of the inventive handlamp.

Referring to FIGS. 1, 2 and 6, the upper portion of the guard 12, designated 53 in FIG. 3, is in the form of a ring or washer with a central aperture. The aperture in the ring portion 53 is aligned with a corresponding aperture in a thickened central ring portion 54 of the upper shell 19; and the hook 13 is received in the aligned apertures so that the base of the hook 13, designated 57 in FIG. 6, acts as a hinge pin, permitting the lamp guard to rotate relative the shell 19 about an axis lying generally along the vertical center of the lamp housing comprising the shell 19 and guard 12.

As seen best in FIG. 4, where the hook is shown in phantom in its original position, the lower portion of the hook is bifurcated at 60 forming first and second legs 61, 62 which may be pressed together for being fit into the apertures of the ring portions 53, 54. At the upper part of the legs 61, 62, there is formed frusto-conical annular barb or stop 63 which acts as a positioning stop for the hook for securing the hook in the position shown in solid line. At the base of the legs 61, 62, there are formed outwardly projecting feet 68, 69, each in the form of one-half of a disc, which secure the ring beneath the upper central portion 52 of the guard 12 (See FIG. 3).

In summary, the apertures in the ring portions 53, 54 are first aligned and then the curved lead-in portion 55 of the hook 13 is placed in the aligned apertures until the hook is fully inserted and snaps into engagement between the members 53, 54.

Having thus disclosed in detail a preferred embodiment of the invention, persons skilled in the art will be able to modify certain of the structure which has been illustrated and disclosed equivalent elements for those described while practicing the principle of the invention; and it is, therefore, intended that all such modifications and substitutions be embraced as they are included within the spirit and scope of the appended claims.

I claim:

1. An electrical handlamp comprising: a handle; a lamp received in said handle; an opaque back section extending from said handle in the form of a half shell for partially encompassing said lamp; a lamp guard pivotally mounted to said back section adjacent a top of said back section for rotation between an open position and a closed or use position, said guard having a lower curved flange slidably supported by said handle; and a clasp for releasably securing said guard in said closed position.

2. The apparatus of claim 1 wherein said guard is in the form of a grid having horizontally and vertically extending intersecting ribs for protecting said lamp in the closed position, said guard having an aperture at an upper location thereof; said apparatus further comprising a hook adapted to be received in a ring of said guard and extending through an aligned aperture in an upper central portion of said back section for forming a pivot axis for said guard, said pivot axis extending generally through an upright center of said handlamp.

3. The apparatus of claim 2 wherein said hook forming said pivot includes a bifurcated portion at an end thereof, said bifurcated portion of said hook defining a pair of legs which may be pressed together to fit into the aperture of said ring of said guard and said aligned aperture of said shell, said legs defining projecting feet and stop members spaced from said feet for securing an end of said hook to said guard and said shell while forming an upper pivot for said shell.

4. The apparatus of claim 1 wherein said guard defines an actuatable clasp member; and said shell defines a ramp member adjacent an edge thereof and adapted to engage a rear surface of said clasp when said guard is placed in the use position for releasably securing said guard to said shell to protect said lamp in the use position.

5. The apparatus of claim 4 further including a second ramp member spaced from said first ramp member, wherein said ramp members of said shell define ramp surfaces having an increasing thickness from a rear section to a forward section adjacent a forward edge of said shell, and said ramp surfaces are arranged to engage said guard adjacent said clasp to urge said clasp over said ramps when said guard is rotated to the use position, said clasp retaining said guard in the use position by engaging forward surfaces of said ramp sections.

6. The apparatus of claim 1 wherein said handle is formed of two molded pieces, including a forward section and a rear section, said rear molded section of said handle being further integrally molded with said shell for enhancing the beam strength of said lamp when assembled.

* * * * *